(12) United States Patent
Leng et al.

(10) Patent No.: US 7,215,009 B1
(45) Date of Patent: May 8, 2007

(54) EXPANSION PLANE FOR PQFP/TQFP IR—PACKAGE DESIGN

(75) Inventors: Allen Cheah Chong Leng, Bayan Lepas (MY); Tan Ping Chet, Gelugor (MY)

(73) Assignee: Altera Corporation, San Jose, CA (US)

( * ) Notice: Subject to any disclaimer, the term of this patent is extended or adjusted under 35 U.S.C. 154(b) by 280 days.

(21) Appl. No.: 10/785,535

(22) Filed: Feb. 23, 2004

(51) Int. Cl.
*H01L 23/495* (2006.01)

(52) U.S. Cl. ............... 257/667; 257/669; 257/678; 438/411; 438/612; 438/617

(58) Field of Classification Search ......... 257/783, 257/667, 669, 670, 678, 680
See application file for complete search history.

(56) References Cited

U.S. PATENT DOCUMENTS

| | | | |
|---|---|---|---|
| 6,538,313 B1* | 3/2003 | Smith | 257/684 |
| 2002/0056894 A1* | 5/2002 | Kuo et al. | 257/667 |
| 2004/0159918 A1* | 8/2004 | Lee | 257/670 |

OTHER PUBLICATIONS

*Thin Array Plastic Package*, http://www.asat.com/products/data/tapp_0104.pdf.

Marcos Karnezos, N. Chidambaram (Raj) and Martin Goetz, *Performance Enhancements in Edquad Plastic Packages*, http://www.asat.com/products/dg1030.pdf.

*Enhanced Leaded Packages*, http://www.asat.com/products/data/EQUAD.pdf.

*ASAT EDQUAD Plastic Quad Flatpack Package Reliability Assessment Report*, http://www.triquint.com/company/quality/pubs/packages/97-05-edquad.pdf.

* cited by examiner

*Primary Examiner*—Douglas W. Owens
(74) *Attorney, Agent, or Firm*—Morgan, Lewis & Bockius LLP (57) ABSTRACT

Provided is a lead frame package with an expansion plane to minimize electrical parasitics introduced into the semiconductor chip's electrical system (e.g., power delivery system, signal loops, etc.). Also provided are methods for assembling such lead frame packages into various semiconductor packages. Generally, a lead frame package includes a down set die attach pad over an underlying bottom plate. Both the die attach pad and the bottom plate may be used as intermediary connections for either power or ground connections. As compared to conventional lead frame package having an intermediary connection, the lead frame packages of the present invention can provide for any combination of shorter wire bond lengths, more wire bond connections, improved power delivery system, or reduced amounts of electrical parasitics.

36 Claims, 8 Drawing Sheets

EXPANSION PLANE FOR PQFP/TQFP IR—PACKAGE DESIGN

BACKGROUND OF THE INVENTION

This invention relates generally to semiconductor chip package assembly, and in particular to wire bonding package assembly. More specifically, the invention relates to lead frame packages with expansion planes and corresponding methods for their assembly.

In order for a semiconductor chip (also referred to as a "die") to operate, power must be supplied through a power delivery system. Some power delivery systems are configured to include an intermediary connection (e.g., power or ground) integral to the semiconductor chip package, which houses the semiconductor chip. This intermediary connection allows for the distribution of power to or from the semiconductor chip, thereby, facilitating in the operation of the semiconductor chip.

A commonly used intermediary connection is an interposer ring (IR). An interposer ring is often integrated with a lead frame semiconductor package, such as a plastic quad flatpack (PQFP) or a thin quad flatpack (TQFP) semiconductor chip package. A typical interposer ring is composed of a flat sheet of conductive material with a sufficiently sized opening in the middle to house a semiconductor chip. The semiconductor chip is typically centered within the interposer ring opening on a die attach pad, which is used to support the semiconductor chip that sit on it. Since the interposer ring surrounds the semiconductor chip and is further insulated from the die attach pad with an electrical insulator, a wire bond connection for distributing power can be made between the semiconductor chip and the interposer ring. As such, the interposer ring serves as a power ring.

Although the interposer ring provides a good intermediary connection, improvements can still be made. The design of the intermediary connection may have a substantial impact on the performance of the semiconductor chip. In particular, the performance of the semiconductor chip can be substantially affected by electrical parasitics (e.g., inductance) introduced by the intermediary connection into the semiconductor chip's power delivery system. If not controlled, electrical parasitics may adversely affect the performance of the semiconductor chip.

Accordingly, there is a need to provide improved semiconductor chip packages and corresponding packaging methods that can minimize electrical parasitics introduced into the semiconductor chip's electrical system (e.g., power delivery system, signal loops, etc.), thereby, improving the semiconductor chip's performance.

SUMMARY OF THE INVENTION

To achieve the foregoing, the present invention provides a lead frame package with an expansion plane to minimize electrical parasitics introduced into the semiconductor chip's electrical system. The present invention also provides methods for assembling such lead frame packages In one aspect, a semiconductor package includes a die; a wire bonding package substrate positioned under the die where the package substrate has a die attach pad and a plurality of lead fingers surrounding the die attach pad; a plurality of wire bonds electrically connecting the die to the plurality of lead fingers; a bottom plate positioned under the die attach pad; and an insulator set between the die attach pad and the bottom plate such that the die attach pad and the bottom plate are electrically insulated from each other by the insulator.

Generally, the package substrate includes a tie bar connected to the die attach pad. The semiconductor package may even include a molding cap covering at least a portion of the die, package substrate, wire bonds, insulator, and bottom plate. The die attach pad is typically larger than the die such that a portion of the die attach pad is exposed around the die. Additionally, the bottom plate is larger than the die attach pad such that a portion of the bottom plate is exposed around the die attach pad. The plurality of wire bonds may electrically connect to either the exposed portion of the die attach pad, the exposed portion of the bottom plate, or both.

The die attach pad may have an expansion slot whereas the insulator and the bottom plate may have matching expansion slots. The insulator can be selected from the group consisting of a non-conductive adhesive tape and a non-conductive adhesive liquid. The die may even be attached to the die attach pad with a die attach epoxy. Furthermore, the die attach pad is connected to a ground source of the semiconductor package and the bottom plate is connected to a power source of the semiconductor package.

According to various embodiments, the exposed portion of the bottom plate has an alignment structure for aligning the bottom plate with the die attach pad. In one embodiment, the alignment structure include an up-set flange having a surface leveled with the die attach pad. In another embodiment, the alignment structure includes an edge of the bottom plate. Yet, in another embodiment, the alignment structure includes a dowel hole.

In another aspect, a method of assembling a semiconductor package includes the steps of (1) providing a wire bonding package substrate with a die attach pad and a plurality of lead fingers surrounding the die attach pad, the die attach pad having a top surface and a bottom surface; (2) attaching a die to the top surface of the die attach pad; (3) setting in place an insulator to a bottom plate; (4) attaching the bottom plate to the bottom surface of the die attach pad such that the bottom plate and the die attach pad are electrically insulated from each other by the insulator; and (5) electrically connecting a plurality of wire bonds from the die to the plurality of lead fingers.

Generally, the method also includes forming a molding cap covering at least a portion of the die, package substrate, wire bonds, insulator, and bottom plate. The die attach pad is typically larger than the die such that a portion of the die attach pad is exposed around the die. Additionally, the bottom plate is larger than the die attach pad such that a portion of the bottom plate is exposed around the die attach pad. As such, the method may also include electrically connecting the plurality of wire bonds to either the exposed portion of the die attach pad or the exposed portion of the bottom plate, or both.

The die attach pad may have an expansion slot whereas the insulator and the bottom plate may have matching expansion slots. The insulator can be selected from the group consisting of a non-conductive adhesive tape and a non-conductive adhesive liquid. The die may even be attached to the die attach pad with a die attach epoxy. Furthermore, the die attach pad is connected to a ground source of the semiconductor package and the bottom plate is connected to a power source of the semiconductor package.

According to various embodiments, attaching the bottom plate to the bottom surface of the die attach pad includes aligning the bottom plate with the die attach pad with an alignment structure that is integrated with the exposed portion of the bottom plate. In one embodiment, the alignment structure is an up-set flange with a surface leveled with the top surface of the die attach pad. In another embodiment, the alignment structure is an edge of the bottom plate. Yet, in another embodiment, the alignment structure is a dowel hole.

In yet another aspect, a semiconductor package includes a die; a wire bonding package substrate positioned under the die, the package substrate having a die attach pad and a plurality of lead fingers surrounding the die attach pad; a plurality of wire bonds electrically connecting the die to the plurality of lead fingers; a bottom plate positioned under the die attach pad, wherein the bottom plate and the die attach pad have means for lowering inductance; and an insulator set between the die attach pad and the bottom plate such that the die attach pad and the bottom plate are electrically insulated from each other by the insulator.

These and other features and advantages of the invention will be presented in more detail below with reference to the associated drawings.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a lead frame package with an expansion plane to minimize electrical parasitics introduced into the semiconductor chip's electrical system (e.g., power delivery system, signal loops, etc.). The present invention also provides methods for assembling such lead frame packages into various semiconductor packages. Generally, a lead frame package is a type of wire bonding package that utilizes wire bonds to connect the semiconductor chip with corresponding package leads for external connection. As compared to conventional lead frame packages having an intermediary connection, the lead frame packages of the present invention can provide for any combination of shorter wire bond lengths, more wire bond connections, improved power delivery system, or reduced amounts of electrical parasitics.

Figure 1:
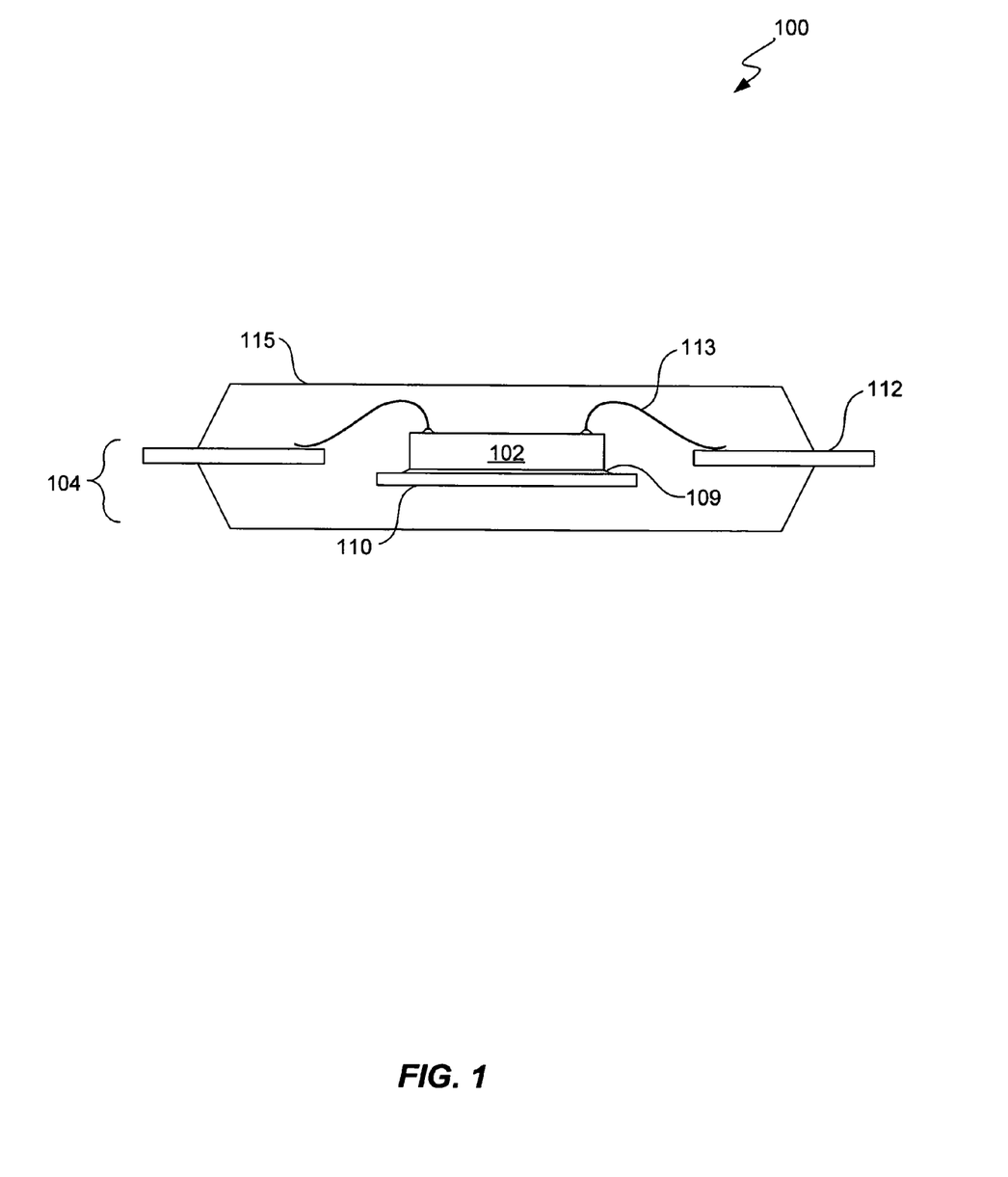
FIG. 1 illustrates a cross-sectional view of a typical lead frame package according to various embodiments of the present invention.

The present invention is generally applicable to different types of wire bonding packages. One type is shown in FIG. 1, which illustrates a cross-sectional view of a typical lead frame package 100 according to various embodiments of the present invention. As shown, a lead frame package substrate 104 includes a die attach pad 110 and corresponding lead fingers 112 (i.e., electrical contacts) disposed about die attach pad 110. During assembly, a die 102 is attached to die attach pad 110 with an adhesive 109 (e.g., die attach epoxy) and conventional wire bonds 113 (e.g., gold wire bonds) are used to electrically couple bond pads (not shown) on die 102 to lead fingers 112. Generally, die attach pad 110 is sized to support die 102. In one specific embodiment, die attach pad 110 is sized to include a surface area larger than that of the footprint of die 102. As such, an exposed portion of die attach pad 110 is available around the attached die 102. After the wire bonding, a molding cap 115 made out of molding compound is formed over at least a portion of die 102, die attach pad 110, adhesive 109, lead fingers 112, and wire bonds 113. Typically, molding cap 115 is formed with any number of molding compounds including, but not limited to: Nitto MP-8000 series (available from Nitto Denko Americas, Fremont, Calif.) and Sumitomo E730J (available from Sumitomo Corporation, Tokyo, Japan). The resulting lead frame package 100 with its exposed portions of lead fingers 112 can then be surface mounted on a printed circuit board or other surface using conventional mounting techniques.

As mentioned earlier, power must be supplied through a power delivery system in order for the semiconductor chip to operate (e.g., running the core logic and I/O circuits in the die). In some cases, power delivery systems are configured to include an intermediary connection (e.g., power or ground) integral to the semiconductor chip package. This intermediary connection allows for the distribution of power to or from the semiconductor chip; thereby, facilitating in the operation of the semiconductor chip. It is important to note, however, that the performance of the semiconductor chip can be substantially affected by electrical parasitics (e.g., inductance) introduced by the intermediary connection into the semiconductor chip's power delivery system. If not controlled, electrical parasitics may adversely affect the performance of the semiconductor chip as will be discussed below.

In controlling electrical parasitics introduced by the semiconductor chip package, many issues must be considered. For example, as the number of inputs and outputs is increased in a semiconductor chip, a corresponding increase in the amount of power to operate the additional load is usually required. However, as the market continues to demand smaller semiconductor chips (e.g., via die scaling), semiconductor chip manufacturers often resort to a decrease in the power supply. With a decrease in the power supply, a lower power voltage generally results. As such, the semiconductor chip's signals (e.g., inputs and outputs) become more susceptible to cross talk where the semiconductor chip's performance is affected. This problem of cross talking can be exacerbated by electrical parasitics (e.g., inductance) introduced by an intermediary connection into the electrical system. Therefore, the intermediary connection of the present invention is designed for minimizing inductance contributed directly or indirectly by the intermediary connection.

In addition, during its operation, a semiconductor chip may experience some degree of simultaneous switching noise (SSN). This may occur when multiple drivers switch simultaneously causing a voltage ripple in the semiconductor chip's power delivery system and offsetting the voltage reference within the semiconductor chip package from its specified value. This voltage reference shift is commonly known as SSN and can be exacerbated by inductance introduced by the intermediary connection. As a result, SSN may cause errors in the operation of the semiconductor chip (e.g., drivers not responding correctly). Therefore, the more SSN present, the less reliable the semiconductor chip's performance will become.

Generally, the expansion plane of the present invention is integrated into the semiconductor chip package and serves as an intermediary connection for either power or ground. Due to the design and arrangement of the expansion plane in relation to other semiconductor chip package components (e.g., lead fingers), electrical parasitics can be effectively controlled (e.g., by shortening wire bond lengths and/or providing larger cross sectional areas for electrical paths). Typically, the expansion plane is positioned below the die attach pad as a separate plate. In one preferred embodiment, the die attach pad and expansion plane are stacked together and electrically insulated from one another such that the die attach pad is used as a ground connection while the expansion plane is used as a power connection.

Figure 2:
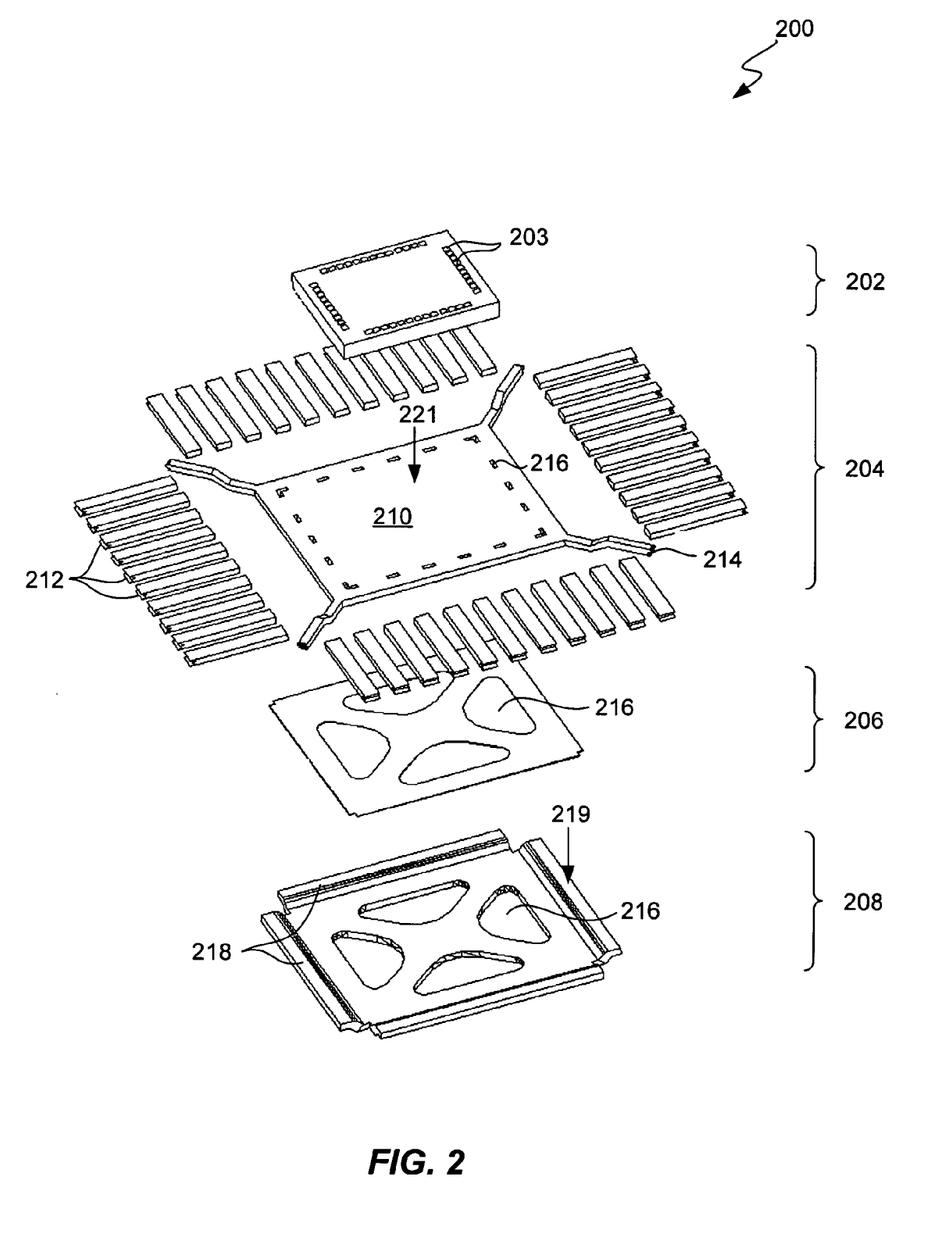
FIG. 2 illustrates a perspective top view of a disassembled lead frame package according to a first embodiment of the present invention.

A variety of strategies are used in controlling electrical parasitics introduced by the intermediary connection. For example, FIG. 2 illustrates a perspective top view of a disassembled lead frame package 200 according to a first embodiment of the present invention. Lead frame package 200 generally includes several components: a die 202, a package substrate 204, an insulator 206, and a bottom plate 208. All the components are configured for assembling together. For example, die 202 sits on package substrate 204, which in turn sits on insulator 206 and bottom plate 208 respectively in that order.

As shown, die 202 includes a plurality of bond pads 203 for electrically connecting to it. On the other hand, package substrate 204 includes a die attach pad 210, a plurality of tie bars 214, and a plurality of lead fingers 212. To fabricate package substrate 204, any conductive material (e.g., copper) may be used. Package substrate 204 usually has die attach pad 210 arranged such that it is surrounded by the plurality of lead fingers 212 and attached to the plurality of tie bars 214. Die attach pad 210 may also be arranged so that it is lower than the plurality of lead fingers 212. This arrangement is commonly referred to as a "down set die attach pad". In order to facilitate thermal expansion, die attach pad 210 may include a plurality of expansion slots 216. The size and number of expansion slots 216 will depend on the amount of thermal expansion anticipated. Similar to die attach pad 210, insulator 206 and bottom plate 208 may also have expansion slots 216. The expansion slot configurations for any combination of die attach pad 210, insulator 206, and bottom plate 208 may also match.

Generally, the purpose of insulator 206 is to electrically insulate bottom plate 208 from die attach pad 210. Therefore, the shape and size of insulator 206 will often depend on the size and shape of either die attach pad 210, bottom plate 208, or both. Any material may be used for insulator 206 provided that die attach pad 210 does not electrically short with bottom plate 208 there between. For instance, insulator 206 may include an electrically non-conductive adhesive tape or an electrically non-conductive adhesive liquid.

As for bottom plate 208, any conductive material such as copper alloy may be used for fabricating it. Typically, bottom plate 208 is formed to include an alignment structure 218. Any alignment structure may be used to properly align bottom plate 208, insulator 206, and die attach pad 210 with each other. One advantage of having alignment structure 218 is to facilitate proper electrical insulation between bottom plate 208 and die attach pad 210. In the embodiment illustrated in FIG. 2, bottom plate 208 includes alignment structure 218 that is an up-set flange. Typically, the up-set flange has a surface 219 leveled with a top surface 221 of die attach pad 210.

Figure 3:
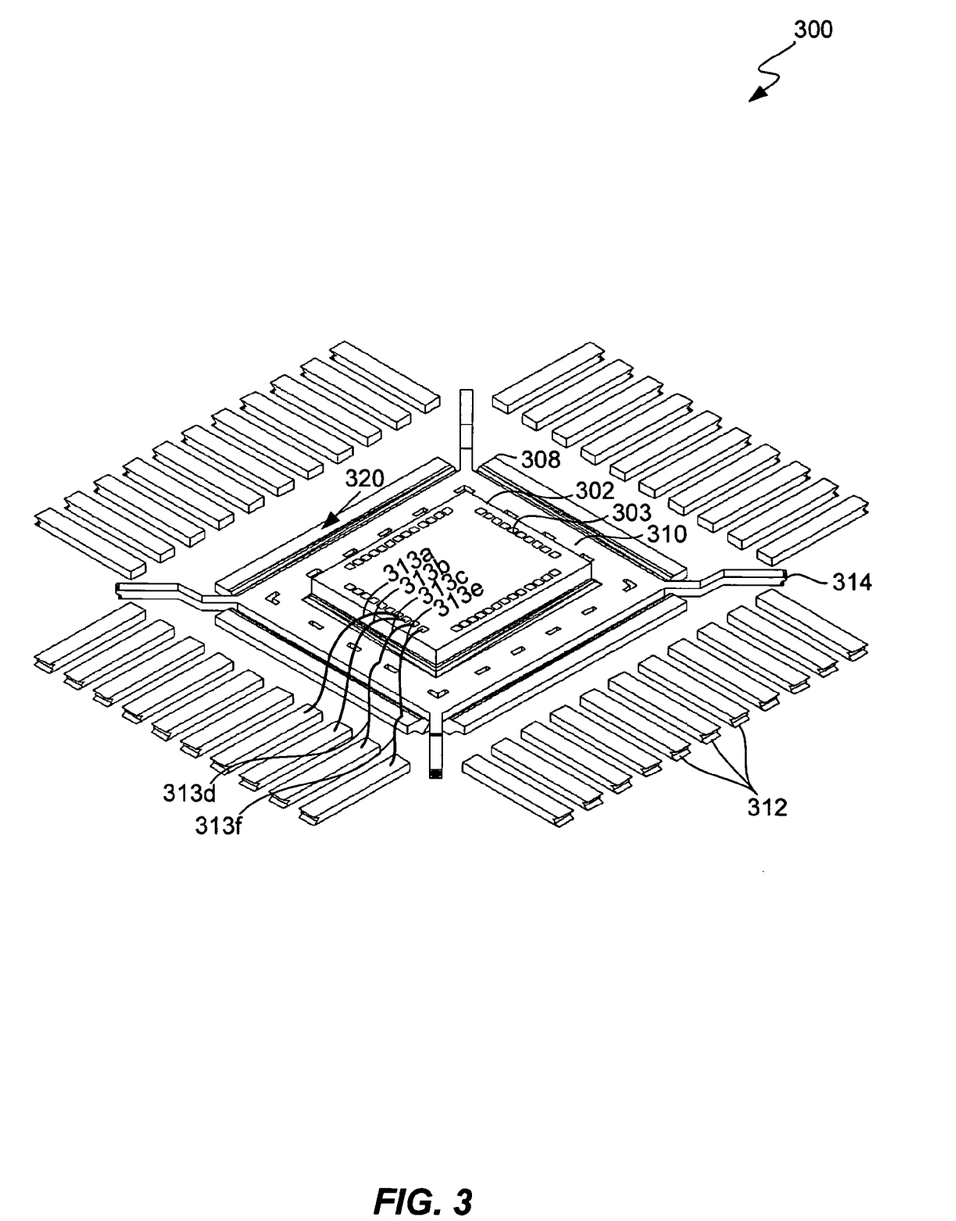
FIG. 3 illustrates a perspective top view of an assembled lead frame package according to a first embodiment of the present invention.

FIG. 3 illustrates a perspective top view of an assembled lead frame package 300 according to the first embodiment of the present invention described above with regard to FIG. 2. Lead frame package 300 shares similar components and processes as for lead frame package 200. As assembled, die attach pad 310 may serve as an intermediary connection for ground whereas bottom plate 308 may serve as an intermediary connection for power. Alternatively, die attach pad 310 may serve as an intermediary connection for power whereas bottom plate 308 may serve as an intermediary connection for ground. Accordingly, die attach pad 310 and bottom plate 308 (i.e., expansion plane) can be adapted for connecting to either a power or ground source.

An expansion plane can be of any shape or size, but will generally have exposed portions 320 for making electrical connections thereon. Any conventional packaging technique may be used to make available these exposed portions. For example, an underlying expansion plane (e.g., bottom plate 308) may be sized larger than the overlaying die attach pad 310 such that an exposed portion of the underlying expansion plane is made available for electrical connections. This can be achieved by forming cut outs (e.g., via etching techniques) in the overlaying die attach pad 310. Another example is by having the expansion plane sized larger than anything (e.g., die attach pad 310) covering it.

As compared to conventional lead frame packages, it is important to note that the down set die attach pad 310 (as supported by tie bars 314) allows for die 302 to be set lower and for bond pads 303 to be positioned closer to lead fingers 312. As such, shorter wire bonds can be realized between die 302 and lead fingers 312 (e.g., 313a, 313b). In addition, wire bonds for ground (e.g., 313c, 313d) or for power (e.g., 313e, 313f) may also be shorter. This is because the die attach pad and the expansion plane (especially the up set flange portion) can be sized to get as close as possible to lead fingers 312.

An advantage of having short wire bonds is that they have lower amounts of inductance and resistance. From the assembly point of view, shorter wire bonds also present the advantage of being more taut. Therefore, less sag in the wire bonds will occur and spacing between adjacent wire bonds can be maintained. With less wire bond sag, electrical shorting between wire bonds can be prevented during the formation of a molding cap as longer wire bonds tend to sway with the flow of the molding compound. It will be appreciated by persons skilled in the art that the relative arrangement of die 302, die attach pad 310, bottom plate 308 and lead fingers 312 can be adjusted to achieve a minimal amount of electrical parasitics being introduced by the lead frame package into the semiconductor chip's electrical system.

Figure 4:
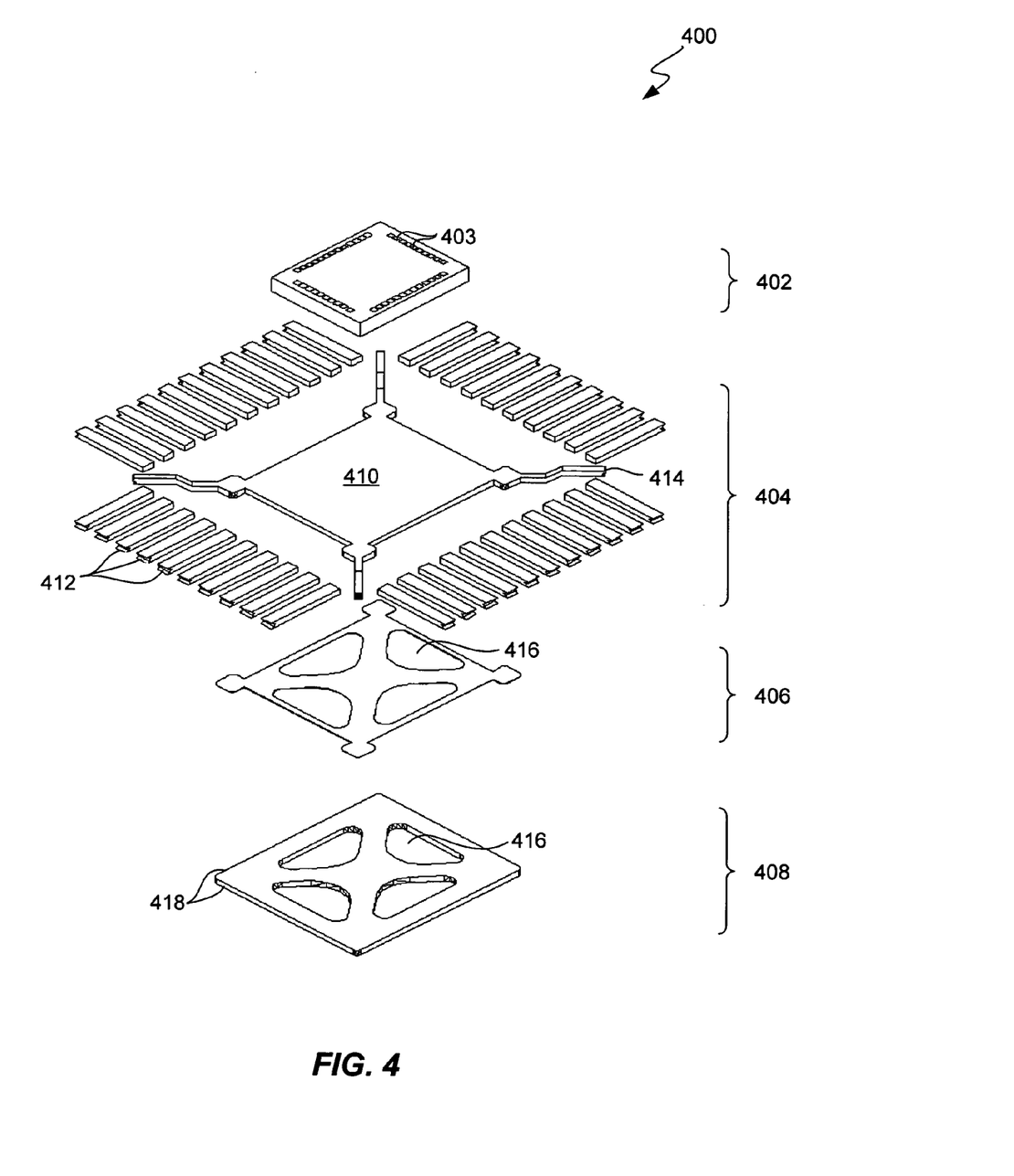
FIG. 4 illustrates a perspective top view of a disassembled lead frame package according to a second embodiment of the present invention.

Next, FIG. 4 illustrates a perspective top view of a disassembled lead frame package 400 according to a second embodiment of the present invention. Lead frame package 400 shares similar components and processes as for lead frame package 200. Lead frame package 400 also includes several components: a die 402, a package substrate 404, an insulator 406, and a bottom plate 408. All the components are configured for assembling together. For example, die 402 sits on package substrate 404, which in turn sits on insulator 406 and bottom plate 408 respectively in that order.

As shown, die 402 includes a plurality of bond pads 403 for electrically connecting to it. On the other hand, package substrate 404 includes a die attach pad 410, a plurality of tie bars 414, and a plurality of lead fingers 412. To fabricate package substrate 404, any conductive material (e.g., copper) may be used. Package substrate 404 usually has die attach pad 410 arranged such that it is surrounded by the plurality of lead fingers 412 and attached to the plurality of tie bars 414. Die attach pad 410 may also be arranged so that it is lower than the plurality of lead fingers 412. In order to facilitate thermal expansion, die attach pad 410 may include a plurality of expansion slots (not shown). The size and number of expansion slots will depend on the amount of thermal expansion anticipated. As illustrated, insulator 406 and bottom plate 408 have expansion slots 416. The expansion slot configurations for any combination of die attach pad 410, insulator 406 and bottom plate 408 may match.

In regards to insulator 406, the shape and size will often depend on the size and shape of either die attach pad 410, bottom plate 408, both. Any material may be used for insulator 406 provided that die attach pad 410 does not electrically short with bottom plate 408 there between. For instance, insulator 406 may include an electrically non-conductive adhesive tape or an electrically non-conductive adhesive liquid.

As for bottom plate 408, any conductive material such as copper alloy may be used for fabricating it. Bottom plate 408 is formed to include an alignment structure 418. In this embodiment, bottom plate 408 includes alignment structure 418 that is an edge of bottom plate 408. The edge of bottom plate 408 is used to align with an edge of either insulator 406 or die attach pad 410 (e.g., an edge of the small corner square as shown in FIG. 4).

Figure 5:
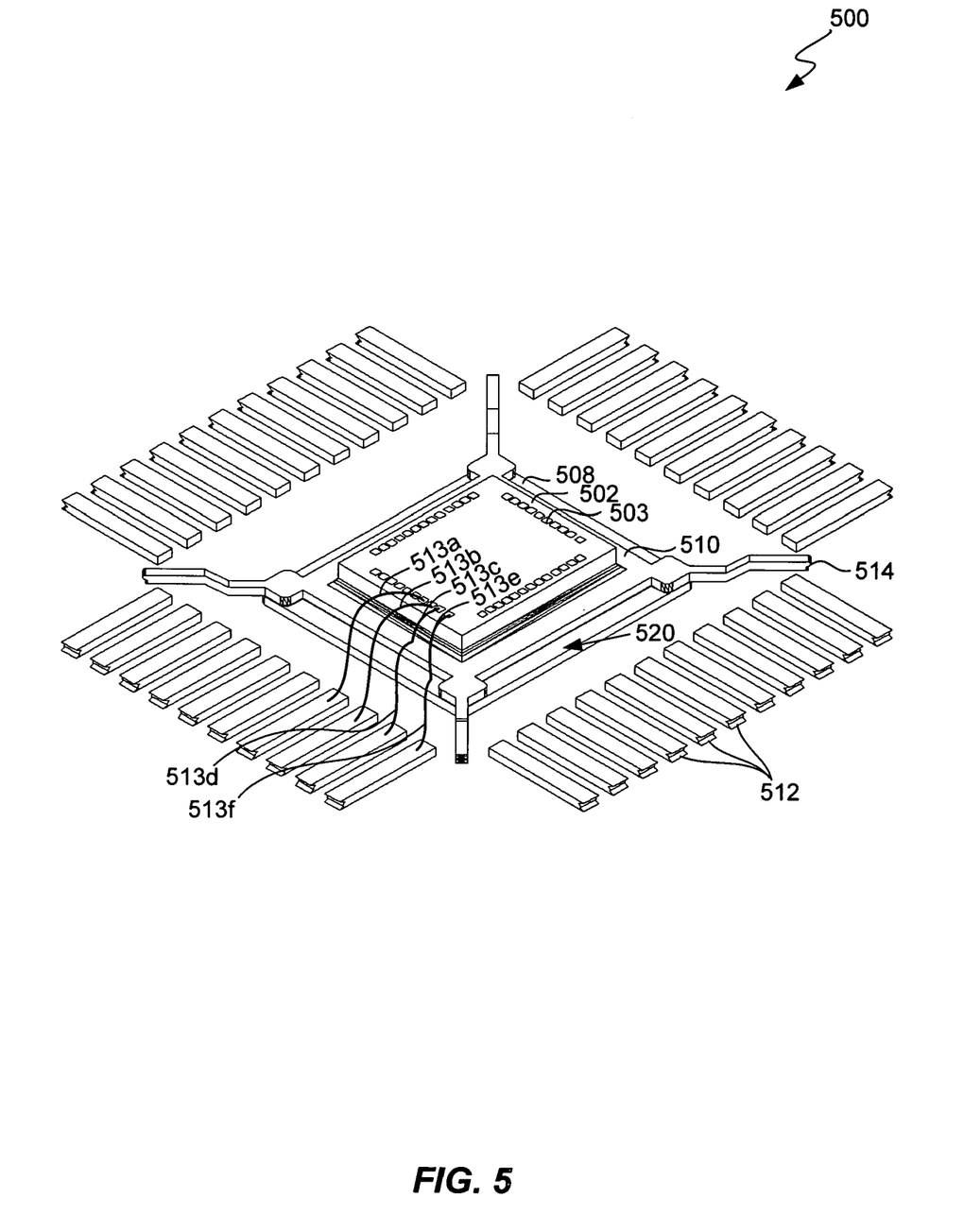
FIG. 5 illustrates a perspective top view of an assembled lead frame package according to a second embodiment of the present invention.

FIG. 5 illustrates a perspective top view of an assembled lead frame package 500 according to a second embodiment of the present invention described above with regard to FIG. 4. Lead frame package 500 shares similar components and processes as for lead frame package 400. As assembled, die attach pad 510 may serve as an intermediary connection for ground whereas bottom plate 508 may serve as an intermediary connection for power. Alternatively, die attach pad 510 may serve as an intermediary connection for power whereas bottom plate 508 may serve as an intermediary connection for ground. Accordingly, die attach pad 510 and bottom plate 508 (i.e., expansion plane) can be adapted for connecting to either a power or ground source.

Once again, as compared to conventional lead frame packages, it is important to note that the down set die attach pad 510 (as supported by tie bars 514) allows for die 502 to be set lower and for bond pads 503 to be positioned closer to lead fingers 512. As such, shorter wire bonds can be realized between die 502 and lead fingers 512 (e.g., 513*a*, 513*b*). In addition, wire bonds for ground (e.g., 513*c*, 513*d*) or for power (e.g., 513*e*, 513*f*) may also be shorter. This is because the die attach pad and the expansion plane can be sized to get as close as possible to lead fingers 512. It will be appreciated by persons skilled in the art that the relative arrangement of die 502, die attach pad 510, bottom plate 508 and lead fingers 512 can be adjusted to achieve a minimal amount of electrical parasitics being introduced by the lead frame package into the semiconductor chip's electrical system.

Figure 6:
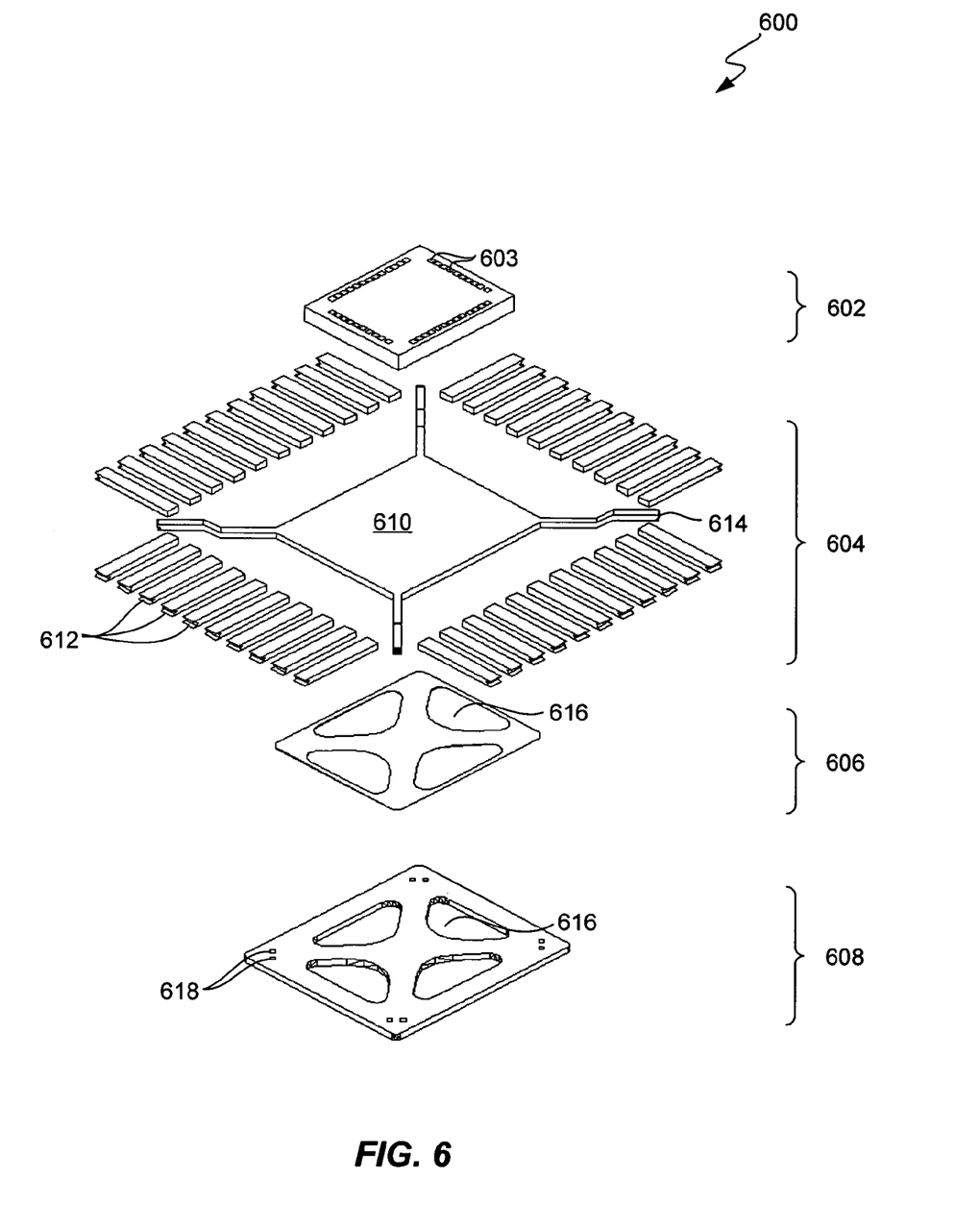
FIG. 6 illustrates a perspective top view of a disassembled lead frame package according to a third embodiment of the present invention.

Finally, FIG. 6 illustrates a perspective top view of a disassembled lead frame package 600 according to a third embodiment of the present invention. Lead frame package 600 shares similar components and processes as for lead frame package 200. Lead frame package 600 also includes several components: a die 602, a package substrate 604, an insulator 606, and a bottom plate 608. All the components are configured for assembling together. For example, die 602 sits on package substrate 604, which in turn sits on insulator 606 and bottom plate 608 respectively in that order.

As shown, die 602 includes a plurality of bond pads 603 for electrically connecting to it. On the other hand, package substrate 604 includes a die attach pad 610, a plurality of tie bars 614, and a plurality of lead fingers 612. To fabricate package substrate 604, any conductive material (e.g., copper) may be used. Package substrate 604 usually has die attach pad 610 arranged such that it is surrounded by the plurality of lead fingers 612 and attached to the plurality of tie bars 614. Die attach pad 610 may also be arranged so that it is lower than the plurality of lead fingers 612. In order to facilitate thermal expansion, die attach pad 610 may include a plurality of expansion slots (not shown). The size and number of expansion slots will depend on the amount of thermal expansion anticipated. As illustrated, insulator 606 and bottom plate 608 have expansion slots 616. The expansion slot configurations for any combination of die attach pad 610, insulator 606, and bottom plate 608 may match.

As mentioned before, the shape and size of insulator 606 will often depend on the size and shape of either die attach pad 610, bottom plate 608, or both. Any material may be used for insulator 606 provided that die attach pad 610 does not electrically short with bottom plate 608 there between. For instance, insulator 606 may include an electrically non-conductive adhesive tape or an electrically non-conductive adhesive liquid.

As for bottom plate 608, any conductive material such as copper alloy may be used for fabricating it. Bottom plate 608 is formed to include an alignment structure 618. In this embodiment, bottom plate 608 includes alignment structure 618 that is a dowel hole. Any number of dowel holes may be used as necessary for alignment. The dowel holes may be used in conjunction with tie bar 614. For example, visual or laser inspection of the dowel holes straddling the sides of the overlaying tie bar 614 may be implemented for proper alignment. In addition, pins for inserting into the dowel holes may be used to further align bottom plate 608 with insulator 606 and die attach pad 610.

Figure 7:
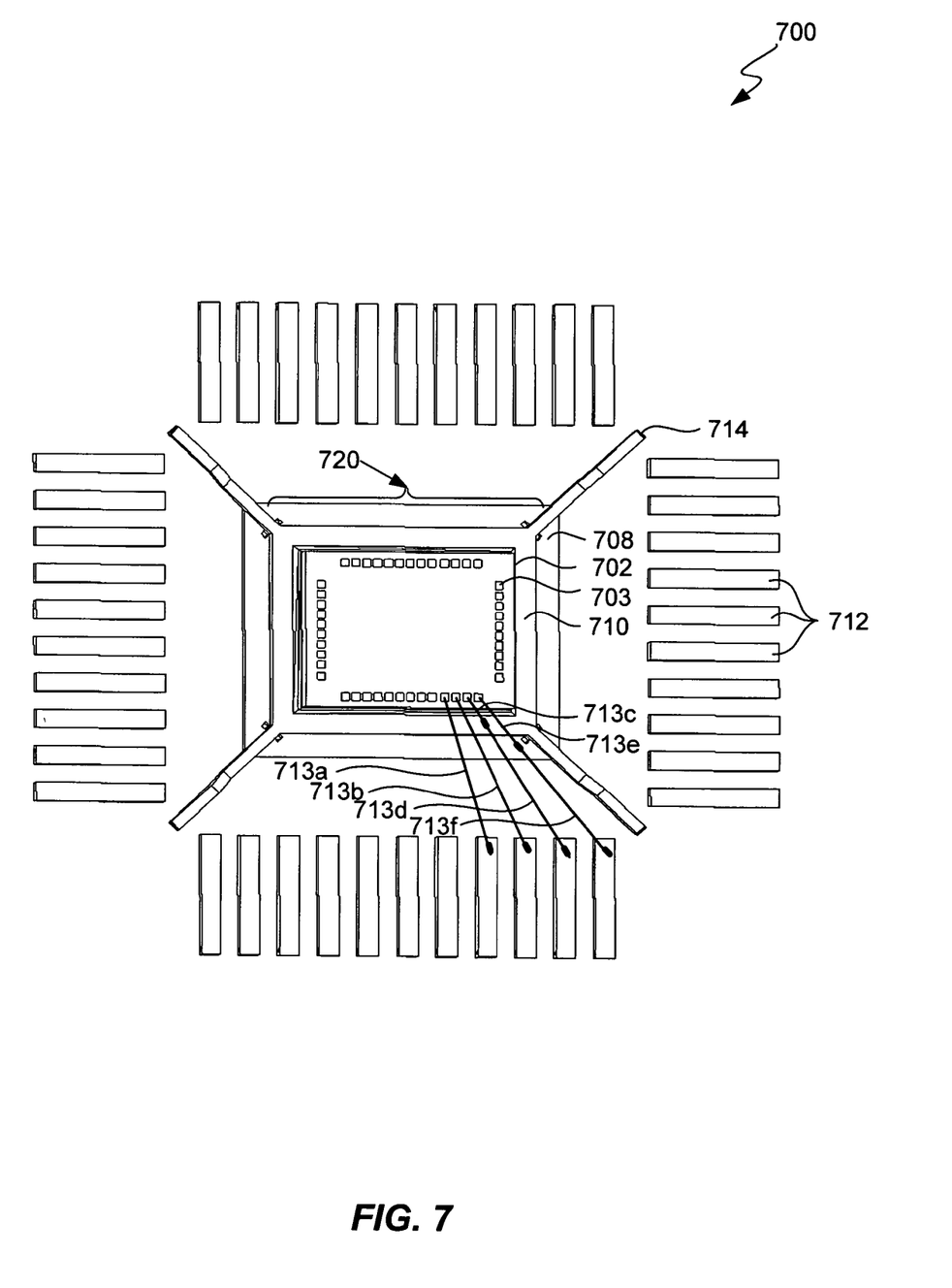
FIG. 7 illustrates a top view of an assembled lead frame package according to a third embodiment of the present invention.

FIG. 7 illustrates a top view of an assembled lead frame package 700 according to a third embodiment of the present invention described above with regards to FIG. 6. Lead frame package 700 shares similar components and processes as for lead frame package 600. As assembled, die attach pad 710 may serve as an intermediary connection for ground whereas bottom plate 708 may serve as an intermediary connection for power. Alternatively, die attach pad 710 may serve as an intermediary connection for power whereas bottom plate 708 may serve as an intermediary connection for ground. Accordingly, die attach pad 710 and bottom plate 708 (i.e., expansion plane) can be adapted for connecting to either a power or ground source.

Yet, as compared to conventional lead frame packages, it is important to note that the down set die attach pad 710 (as supported by tie bars 714) allows for die 702 to be set lower and for bond pads 703 to be positioned closer to lead fingers 712. As such, shorter wire bonds can be realized between die 702 and lead fingers 712 (e.g., 713*a*, 713*b*). In addition, wire bonds for ground (e.g., 713*c*, 713*d*) or for power (e.g., 713*e*, 713*f*) may also be shorter. This is because the die attach pad and the expansion plane can be sized to get as close as possible to lead fingers 712. It will be appreciated by persons skilled in the art that the relative arrangement of die 702, die attach pad 710, bottom plate 708 and lead fingers 712 can be adjusted to achieve a minimal amount of electrical parasitics being introduced by the lead frame package into the semiconductor chip's electrical system.

An advantage of having an expansion plane of the present invention is that it introduces a lower amount of inductance as compared to that of a narrow intermediary connection, such as an interposer ring. This is because in addition to possibly having shorter wire bonds, the expansion plane itself can be designed to provide shorter electrical paths. For example, in connecting to opposite corners of the die, an interposer ring allows electricity to travel along the conductive ring in a L-shape path. In contrast, the expansion plane can allow electricity to travel across the expansion plane in a diagonal path, which is relatively shorter. Similar to wire bonds, a shorter electrical path will produce less inductance as electricity flows through it.

Another advantage is the enhanced flexibility inherent to the expansion plane. Since the expansion plane has exposed portions that are generally larger than that provided by a conventional intermediary connection, multiple wire bond connections can be realized thereon. By having multiple connections, the overall amount of inductance introduced by the wire bonds can be further reduced since less current will travel within each wire bond. This is because multiple wire bonds increases the effective cross sectional area for which the electricity can flow. That is, multiple wire bonds can share the total amount of current. As such, lower resistance and inductance will be introduced into the electrical system. By the same token, the expansion plane provides for a larger cross sectional area for electricity to travel and will also lower the resistance and inductance that will be introduced into the electrical system.

Yet another advantage of having the expansion plane of the present invention is that when combined with the die attach pad and separated by the insulator, the combination can act as a capacitor and be a source for power. This is because the die attach pad and the expansion plane acts as capacitor plates. A capacitor typically stores energy when charged and can be recharged as needed. It may be used in combination with another power source (e.g., system power supply). When integrated in a semiconductor chip's power delivery system, the capacitor (depending on its location) can provide power to the die and its components (e.g., drivers) while introducing relatively low impedance in the semiconductor chip's power delivery system. In other words, a capacitor can effectively be a source of power while minimizing SSN if located close (e.g., within the semiconductor chip package) to the die. For instance, by having a shorter electrical connection between the driver and its power source, a smaller amount of resistance and inductance is introduced in the power to ground loop or between the driver and its power source. As a result, a smaller voltage drop (hence, lower SSN) and a shorter time delay can occur.

Figure 8:
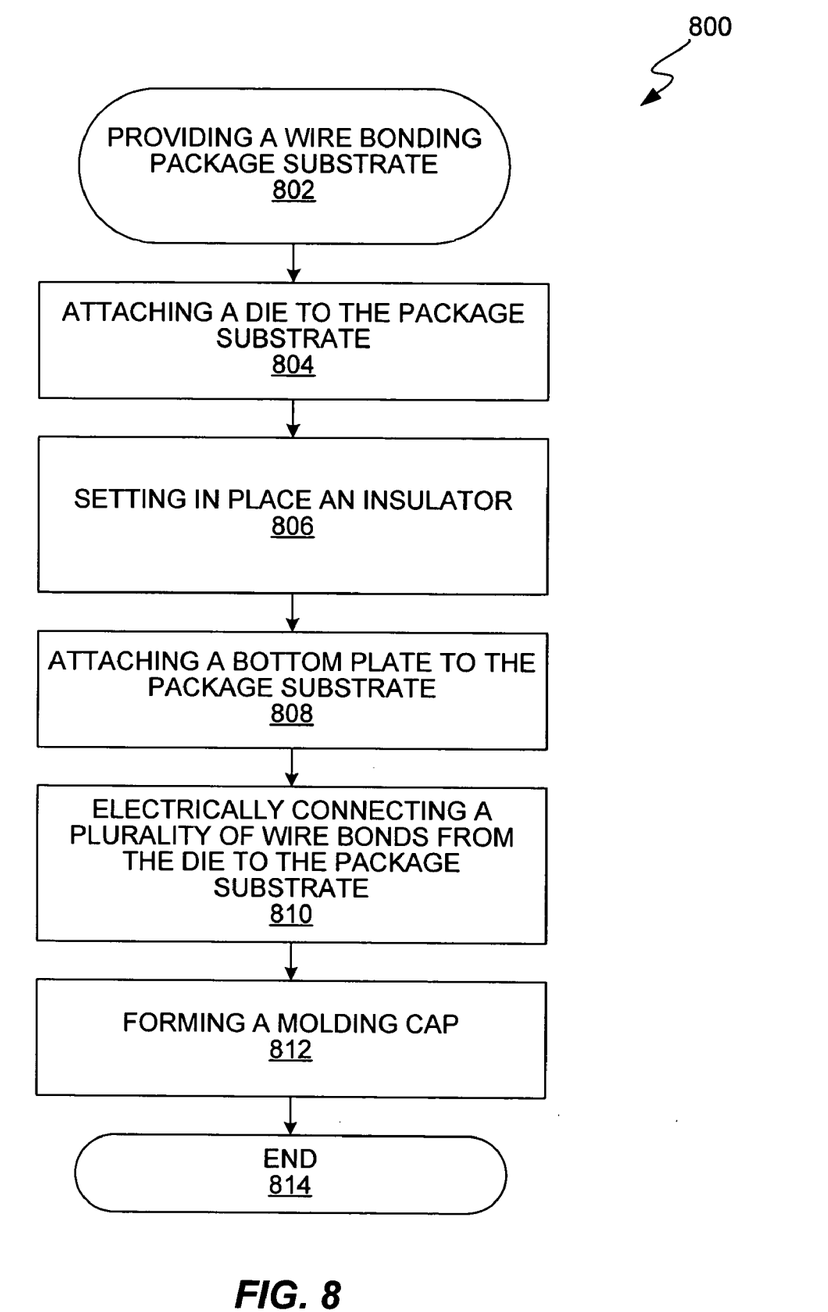
FIG. 8 illustrates a flow diagram of forming a lead frame package according to various embodiments of the present invention.

The semiconductor packages described in the present invention may be constructed using any number of methods. For example, FIG. 8 illustrates a flow diagram 800 of forming a lead frame package according to various embodiments of the present invention. Beginning at operation 802, the providing of a wire bonding package substrate is performed. Any wire bonding packaging substrate (e.g., 104; 204; 404; 604) can be used for this purpose. Next, attaching a die to the package substrate is performed in operation 804. The die may be attached to the die attach pad with die attach epoxy. Further, in operation 806, setting in place an insulator is performed. The insulator may be either a non-conductive adhesive tape or a non-conductive adhesive liquid. The insulator may either be set against either the package substrate or a bottom plate. Any method may be used to set the insulator in place. For example, brushing, dispensing, curing, or affixing may all be used to set the insulator in place.

After setting in place the insulator, attaching the bottom plate to the package substrate may be performed in operation 808. In a specific embodiment, the bottom plate is attached to the bottom of the die attach pad. Generally, the bottom plate will be electrically insulated from the die attach pad by the insulator. Next, electrically connecting a plurality of wire bonds from the die to the package substrate may be performed in operation 810. Any conventional wire bonding process may be used. Afterwards, forming a molding cap is performed in operation 812. The molding cap will often cover at least a portion of the die, package substrate, wire bonds, insulator, and/or bottom plate. Finally, process 800 ends at operation 814. It is important to note that it will be appreciated by persons of ordinary skill in the art that some of the process operations may be reordered or eliminated. For example, operation 806 can be reordered with operation 804 such that the setting in place an insulator can be performed before attaching a die to the package substrate.

CONCLUSION

The foregoing invention presents many advantages over conventional lead frame packages having an integral intermediary connection and semiconductor packages that incorporate them. For example, the present invention provides an improved lead frame package solution for controlling electrical parasitics. In addition, the present invention provides additional capacitance for better power delivery. As a result, less cross-talking and less SNN may be achieved in improving the semiconductor chip's performance.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor package, comprising:
   a die;
   a wire bonding package substrate positioned under the die, the package substrate having a die attach pad and a plurality of lead fingers surrounding the die attach pad;

a plurality of wire bonds electrically connecting the die to the plurality of lead fingers;

a bottom plate positioned under the die attach pad; and an insulator set between the die attach pad and the bottom plate such that the die attach pad and the bottom plate are electrically insulated from each other by the insulator;

wherein at least one of the bottom plate and the insulator has at least one expansion slot.

2. The semiconductor package of claim 1, wherein the package substrate includes a tie bar connected to the die attach pad.

3. The semiconductor package of claim 1, further comprising:

a molding cap covering at least a portion of the die, package substrate, wire bonds, insulator, and bottom plate.

4. The semiconductor package of claim 1, wherein the die attach pad is larger than the die such that a portion of the die attach pad is exposed around the die.

5. The semiconductor package of claim 4, wherein the bottom plate is larger than the die attach pad such that a portion of the bottom plate is exposed around the die attach pad.

6. The semiconductor package of claim 5, wherein the plurality of wire bonds electrically connects to the exposed portion of the die attach pad.

7. The semiconductor package of claim 6, wherein the plurality of wire bonds electrically connects to the exposed portion of the bottom plate.

8. The semiconductor package of claim 5, wherein the exposed portion of the bottom plate has an alignment structure for aligning the bottom plate with the die attach pad.

9. The semiconductor package of claim 8, wherein the alignment structure is an up-set flange.

10. The semiconductor package of claim 9, wherein the up-set flange has a surface leveled with the die attach pad.

11. The semiconductor package of claim 8, wherein the alignment structure is an edge of the bottom plate.

12. The semiconductor package of claim 8, wherein the alignment structure is a dowel hole.

13. The semiconductor package of claim 1, wherein the insulator and the bottom plate have matching expansion slots.

14. The semiconductor package of claim 1, wherein the die attach pad has an expansion slot.

15. The semiconductor package of claim 1, wherein the insulator is selected from the group consisting of a non-conductive adhesive tape and a non-conductive adhesive liquid.

16. The semiconductor package of claim 1, wherein the die is attached to the die attach pad with a die attach epoxy.

17. The semiconductor package of claim 1, wherein the die attach pad is connected to a ground source of the semiconductor package and the bottom plate is connected to a power source of the semiconductor package.

18. A method of assembling a semiconductor package, comprising:

providing a wire bonding package substrate with a die attach pad and a plurality of lead forgers surrounding the die attach pad, the die attach pad having a top surface and a bottom surface;

attaching a die to the top surface of the die attach pad;

setting in place an insulator to a bottom plate;

attaching the bottom plate to the bottom surface of the die attach pad such that the bottom plate and the die attach pad are electrically insulated from each other by the insulator;

electrically connecting a plurality of wire bonds from the die to the plurality of lead fingers; and providing at least one expansion slot within at least one of the bottom plate and the insulator.

19. The method of claim 18, further comprising:

forming a molding cap covering at least a portion of the die, package substrate, wire bonds, insulator, and bottom plate.

20. The method of claim 18, wherein the die attach pad is larger than the die such that a portion of the die attach pad is exposed around the die.

21. The method of claim 20, wherein the bottom plate is larger than the die attach pad such that a portion of the bottom plate is exposed around the die attach pad.

22. The method of claim 21, further comprising:

electrically connecting the plurality of wire bonds to the exposed portion of the die attach pad.

23. The method of claim 22, further comprising:

electrically connecting the plurality of wire bonds to the exposed portion of the bottom plate.

24. The method of claim 21, wherein attaching the bottom plate to the bottom surface of the die attach pad includes aligning the bottom plate with the die attach pad with an alignment structure that is integrated with the exposed portion of the bottom plate.

25. The method of claim 24, wherein the alignment structure is an up-set flange.

26. The method of claim 25, wherein the up-set flange has a surface leveled with the top surface of the die attach pad.

27. The method of claim 24, wherein the alignment structure is an edge of the bottom plate.

28. The method of claim 24, wherein the alignment structure is a dowel hole.

29. The method of claim 18, wherein the insulator and the bottom plate have matching expansion slots.

30. The method of claim 18, wherein the die attach pad has an expansion slot.

31. The method of claim 18, wherein the insulator is selected from the group consisting of a non-conductive adhesive tape and a non-conductive adhesive liquid.

32. The method of claim 18, wherein the die is attached to the die attach pad with a die attach epoxy.

33. The method of claim 18, wherein the die attach pad is connected to a ground source of the semiconductor package and the bottom plate is connected to a power source of the semiconductor package.

34. A semiconductor package, comprising:

a die;

a wire bonding package substrate positioned under the die, the package substrate having a die attach pad and a plurality of lead fingers surrounding the die attach pad;

a plurality of wire bonds electrically connecting the die to the plurality of lead fingers;

a bottom plate positioned under the die attach pad, wherein the bottom plate and the die attach pad have means for lowering inductance; and an insulator set between the die attach pad and the bottom plate such that the die attach pad and the bottom plate are electrically insulated from each other by the insulator;

wherein at least one of the bottom plate and the insulator has at least one expansion slot therein.

35. A semiconductor package, comprising:
a die;
a wire bonding package substrate positioned under the die, the package substrate having a die attach pad and a plurality of lead fingers surrounding the die attach pad;
a plurality of wire bonds electrically connecting the die to the plurality of lead fingers;
a bottom plate positioned under the die attach pad; and
an insulator set between the die attach pad and the bottom plate such that the die attach pad and the bottom plate are electrically insulated from each other by the insulator,
wherein the bottom plate has an expansion slot.

36. A method of assembling a semiconductor package, comprising:
providing a wire bonding package substrate with a die attach pad and a plurality of lead fingers surrounding the die attach pad, the die attach pad having a top surface and a bottom surface;
attaching a die to the top surface of the die attach pad;
setting in place an insulator to a bottom plate;
attaching the bottom plate to the bottom surface of the die attach pad such that the bottom plate and the die attach pad are electrically insulated from each other by the insulator; and
electrically connecting a plurality of wire bonds from the die to the plurality of lead fingers, wherein the bottom plate has an expansion slot.

* * * * *